(12) United States Patent
Chang et al.

(10) Patent No.: US 7,232,718 B2
(45) Date of Patent: Jun. 19, 2007

(54) METHOD FOR FORMING A DEEP TRENCH CAPACITOR BURIED PLATE

(75) Inventors: Chih-Han Chang, Taipei Hsien (TW); Hsin-Jung Ho, Taipei Hsien (TW); Chang-Rong Wu, Taipei Hsien (TW); Chien-Jung Sun, Taipei Hsien (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 10/605,234

(22) Filed: Sep. 17, 2003

(65) Prior Publication Data

US 2005/0059207 A1 Mar. 17, 2005

(51) Int. Cl.
*H01L 21/8242* (2006.01)

(52) U.S. Cl. ............... 438/243; 438/246; 438/249; 257/301; 257/E29.346

(58) Field of Classification Search ........... 438/249, 438/392, 561, 386, 246
See application file for complete search history.

(56) References Cited

U.S. PATENT DOCUMENTS

| | | | | |
|---|---|---|---|---|
| 5,482,883 A * | 1/1996 | Rajeevakumar | ............ | 438/249 |
| 6,034,390 A * | 3/2000 | Tews | ............ | 257/301 |
| 6,310,375 B1 * | 10/2001 | Schrems | ............ | 257/301 |
| 6,316,310 B1 * | 11/2001 | Wensley et al. | ............ | 438/249 |
| 6,362,040 B1 * | 3/2002 | Tews et al. | ............ | 438/246 |
| 6,486,024 B1 * | 11/2002 | Tews et al. | ............ | 438/246 |
| 6,544,856 B2 * | 4/2003 | Morhard et al. | ............ | 438/392 |
| 6,605,838 B1 * | 8/2003 | Mandelman et al. | ............ | 257/305 |
| 6,638,815 B1 * | 10/2003 | Bronner et al. | ............ | 438/246 |
| 6,667,503 B2 * | 12/2003 | Koike et al. | ............ | 257/301 |
| 6,723,611 B2 * | 4/2004 | Akatsu et al. | ............ | 438/386 |
| 6,821,844 B2 * | 11/2004 | Hsu | ............ | 438/246 |
| 6,861,312 B2 * | 3/2005 | Birner et al. | ............ | 438/243 |
| 6,872,621 B1 * | 3/2005 | Wu | ............ | 438/243 |
| 6,929,998 B2 * | 8/2005 | Chen et al. | ............ | 438/246 |
| 6,987,042 B2 * | 1/2006 | Beintner et al. | ............ | 438/241 |
| 7,122,439 B2 * | 10/2006 | Kwon et al. | ............ | 438/386 |
| 2002/0016035 A1 * | 2/2002 | Wu et al. | ............ | 438/243 |
| 2002/0064913 A1 * | 5/2002 | Adkisson et al. | ............ | 438/241 |
| 2002/0089007 A1 * | 7/2002 | Divakaruni et al. | ............ | 257/302 |
| 2002/0090780 A1 * | 7/2002 | Divakaruni et al. | ............ | 438/246 |
| 2003/0045068 A1 * | 3/2003 | Gutsche et al. | ............ | 438/386 |
| 2004/0016951 A1 * | 1/2004 | Mizushima | ............ | 257/304 |
| 2004/0048441 A1 * | 3/2004 | Akatsu et al. | ............ | 438/386 |
| 2004/0219747 A1 * | 11/2004 | Lin et al. | ............ | 438/249 |
| 2005/0009268 A1 * | 1/2005 | Cheng et al. | ............ | 438/249 |
| 2005/0059207 A1 * | 3/2005 | Chang et al. | ............ | 438/249 |
| 2005/0181557 A1 * | 8/2005 | Jakschik et al. | ............ | 438/246 |

* cited by examiner

*Primary Examiner*—Brook Kebede
*Assistant Examiner*—Khiem Nguyen
(74) *Attorney, Agent, or Firm*—Winston Hsu

(57) ABSTRACT

A method for forming a deep trench capacitor buried plate. A substrate having a pad oxide and a pad nitride is provided. A deep trench is formed in the substrate. A doped silicate film is deposited on a sidewall of the deep trench. A sacrificial layer is deposited in the deep trench, and etched back to expose parts of the doped silicate film. Then, an etching process is performed to remove the exposed doped silicate film and parts of the pad oxide for forming a recess. The sacrificial layer is removed. A silicon nitride layer is deposited to fill the recess and to cover the doped silicate film. Finally, a thermal oxidation process is performed to form a doped ion region. The silicon nitride layer is removed. The doped silicate film is removed.

19 Claims, 8 Drawing Sheets

METHOD FOR FORMING A DEEP TRENCH CAPACITOR BURIED PLATE

BACKGROUND OF INVENTION

1. Field of the Invention

The present invention relates to a method of forming a deep trench capacitor buried plate, and more particularly, to a method for preventing the doped ions from diffusing to the collar region and for avoiding increasing the critical dimension of the deep trench.

2. Description of the Prior Art

As very large scale integration (VLSI) technologies develop, the dimension of the semiconductor elements becomes more and more tiny than before. However, the short channel effect is an obstacle to increase the semiconductor element integration. Before now, some methods are proposed to prevent the short channel effect, such as reducing the thickness of the gate oxide layer or increasing the doped concentration. But these methods lead to some disadvantages, such as lower reliability and lower rate. As a result, a vertical transistor design, which is able to increase the integration, is highly evaluated. Take dynamic random access memory (DRAM) as an example; a deep trench memory integrates the storage capacitor, or even the gate, source, and drain of the transistor into the trench, such that the integration is effectively increased.

Refer to FIG. 1 to FIG. 4, which are schematic diagrams illustrating a method of forming a deep trench capacitor buried plate according to the prior art. As shown in FIG. 1, first a substrate 10 is provided, and a pad oxide layer 12 and a pad nitride layer 14 are deposited on the substrate 10 in turn. Then a deep trench 16 is formed in the substrate 10.

As shown in FIG. 2, an arsenic silicate glass (ASG) layer 18 is deposited on the inner wall of the deep trench 16, and a sacrificial layer (not shown in FIG. 2) is deposited to fill up the deep trench 16. Then the sacrificial layer (not shown) is etched back to expose a portion of the arsenic silicate glass layer 18. Afterward, an etching process is performed to remove the exposed arsenic silicate glass layer 18 such that a collar region 20 is formed in the deep trench 16. Finally another etching process is performed to remove the remaining sacrificial layer (not shown).

As shown in FIG. 3, a deposition process is performed by use of TEOS (tetra-ethyl-ortho-silicate) as a precursor to form a TEOS layer 22 on the inner wall of the deep trench 16. Then a thermal process is performed to diffuse the arsenic ions of the arsenic silicate glass layer 18 into the substrate 10, such that a doped region 24, serving as a buried plate, is formed.

Finally as shown in FIG. 4, an etching process is performed to remove the TEOS layer 22 and the arsenic silicate glass layer 18 as well to carry out the deep trench capacitor buried plate.

As has been pointed out, the prior art method of forming the deep trench capacitor buried plate utilizes a TEOS layer as a barrier layer, and a thermal process is performed to diffuse the arsenic ions into the substrate such that a doped region, serving as a buried plate, is formed. However, since TEOS has poor step coverage ability, a void will easily occur in the opening of the deep trench as the dimension decreases. In addition, as shown in FIG. 3, the TEOS layer 22 does not afford good results as a barrier layer, thus the arsenic ions will easily pass through the TEOS layer 22 and diffuse into the collar region 22. The arsenic ions in the collar region 22 will cause current leakages of the capacitor.

Moreover, the pad oxide layer and the TEOS layer are both composed of silicon oxide, as a consequence when an etching process is performed to remove the TEOS layer, some pad oxide layer will be removed as well. The removal of the pad oxide layer would increase the critical dimension of the deep trench, and further lead to a short circuit between neighboring deep trenches.

SUMMARY OF INVENTION

It is therefore a primary objective of the claimed invention to provide a method of forming a deep trench capacitor buried plate for solving the above-mentioned problems.

According to the claimed invention, a method forming a deep trench capacitor buried plate is disclosed. The method of the present invention comprises: providing a substrate having a pad oxide layer and a pad nitride layer thereon, the pad oxide layer and the pad nitride layer having at least an opening; performing a dry etching process for forming a deep trench in the substrate via the opening; depositing a doped silicate glass film on an inner wall of the deep trench; filling a sacrificial layer into the deep trench; removing a portion of the sacrificial layer for exposing parts of the doped silicate glass film; performing an etching process to remove the exposed doped silicate glass film and a portion of the pad nitride layer for forming a recess; removing the remaining sacrificial layer; depositing a silicon nitride layer on the inner wall of the deep trench; performing a diffusing process for forming a doped region at a bottom of the trench; removing the silicon nitride layer; and removing doped silicate glass film. The silicon nitride layer serves as a barrier layer for preventing ions of the doped silicate glass film from diffusing to a collar region of the deep trench.

These and other objectives of the present invention will no doubt become obvious to those of ordinary skill in the art after having read the following detailed description of the preferred embodiment that is illustrated in the various figures and drawings.

DETAILED DESCRIPTION

Figure 1:
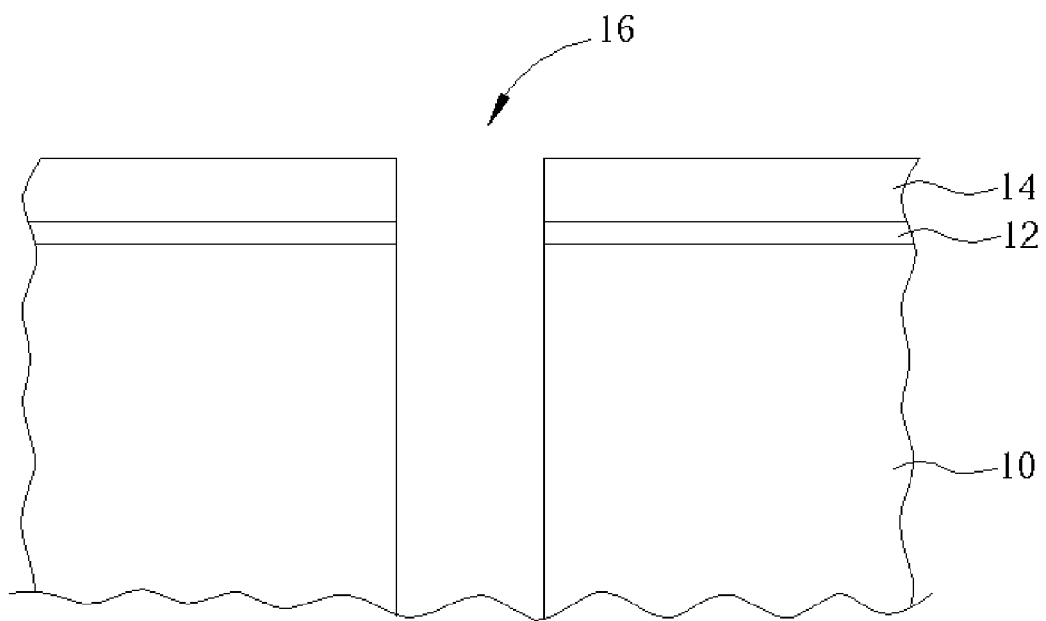
FIG. 1 to FIG. 4 are schematic diagrams illustrating a method of forming a deep trench capacitor buried plate according to the prior art.
Figure 2:
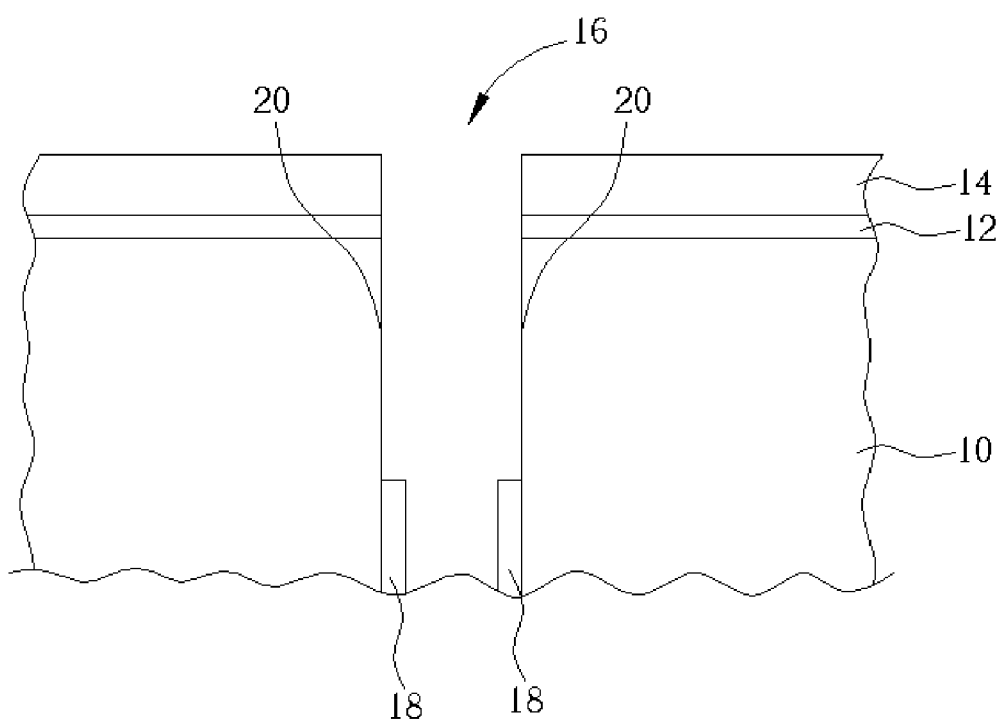
Figure 3:
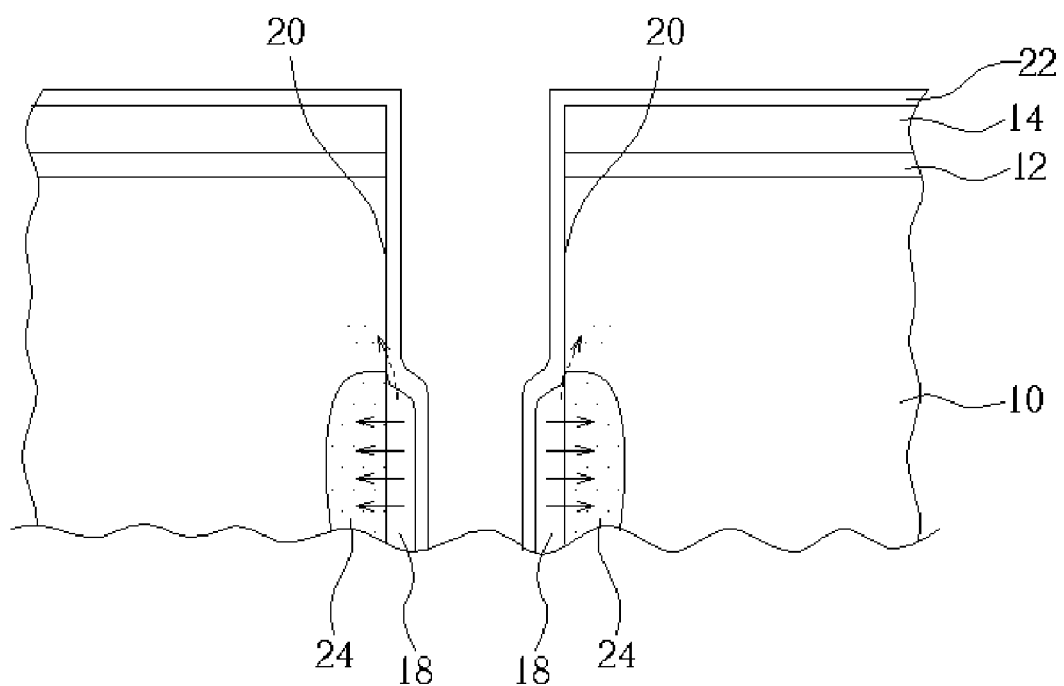
Figure 4:
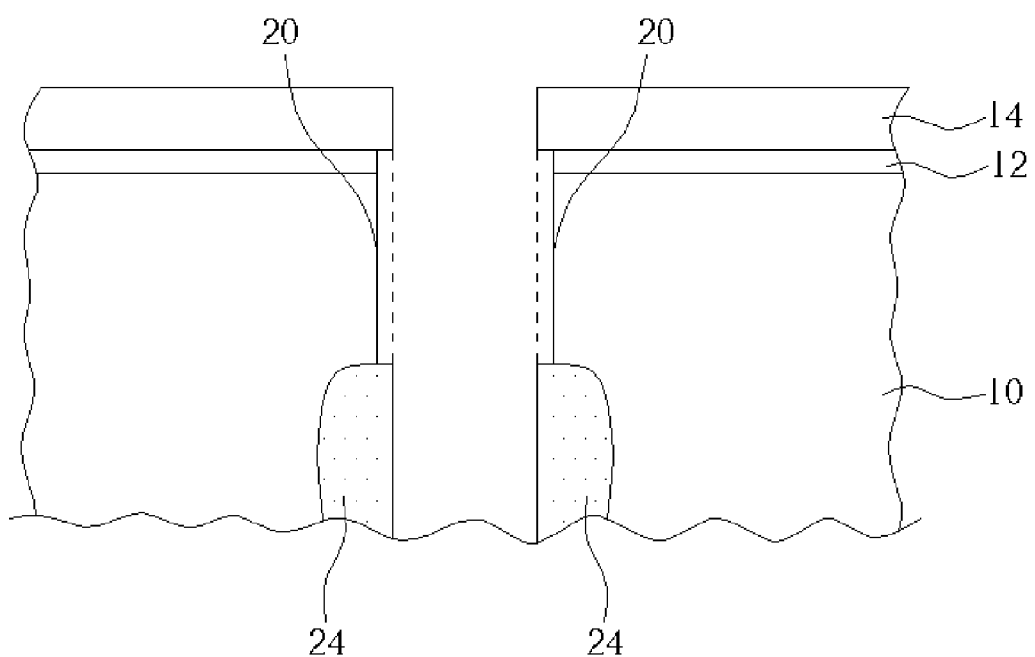
Figure 5:
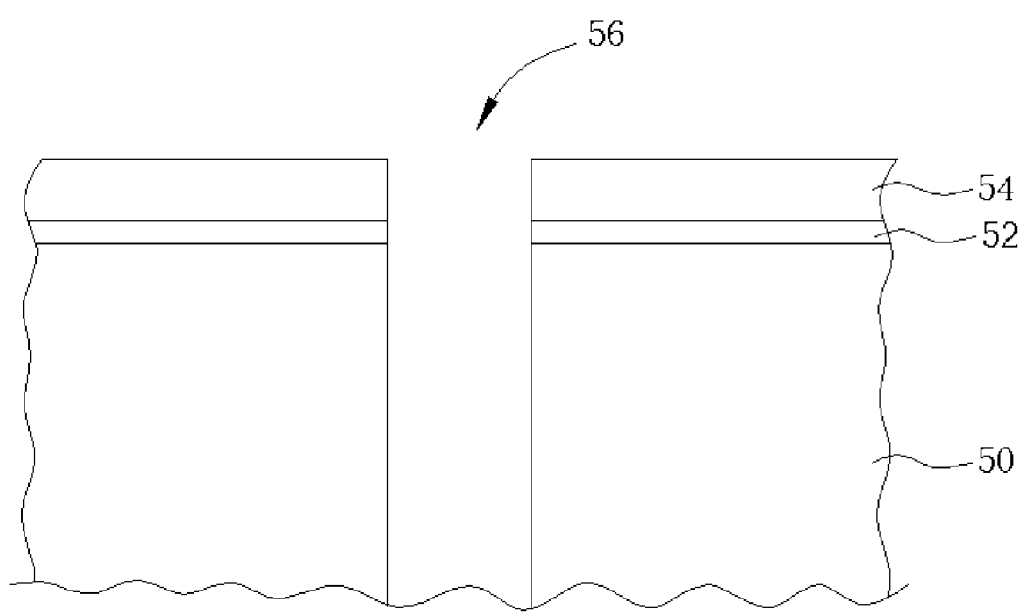
FIG. 5 to FIG. 8 are schematic diagrams illustrating a method of forming a deep trench capacitor buried plate according to the present invention.

Refer to FIG. 5 to FIG. 8, which are schematic diagrams illustrating a method of forming a deep trench capacitor buried plate according to the present invention. As shown in FIG. 5, a substrate 50 is provided, and a pad oxide layer 52 and a pad nitride layer 54 are deposited on the substrate 50 in turn. Then a dry etching process is performed to form a deep trench 56 in the substrate 50.

Figure 6:
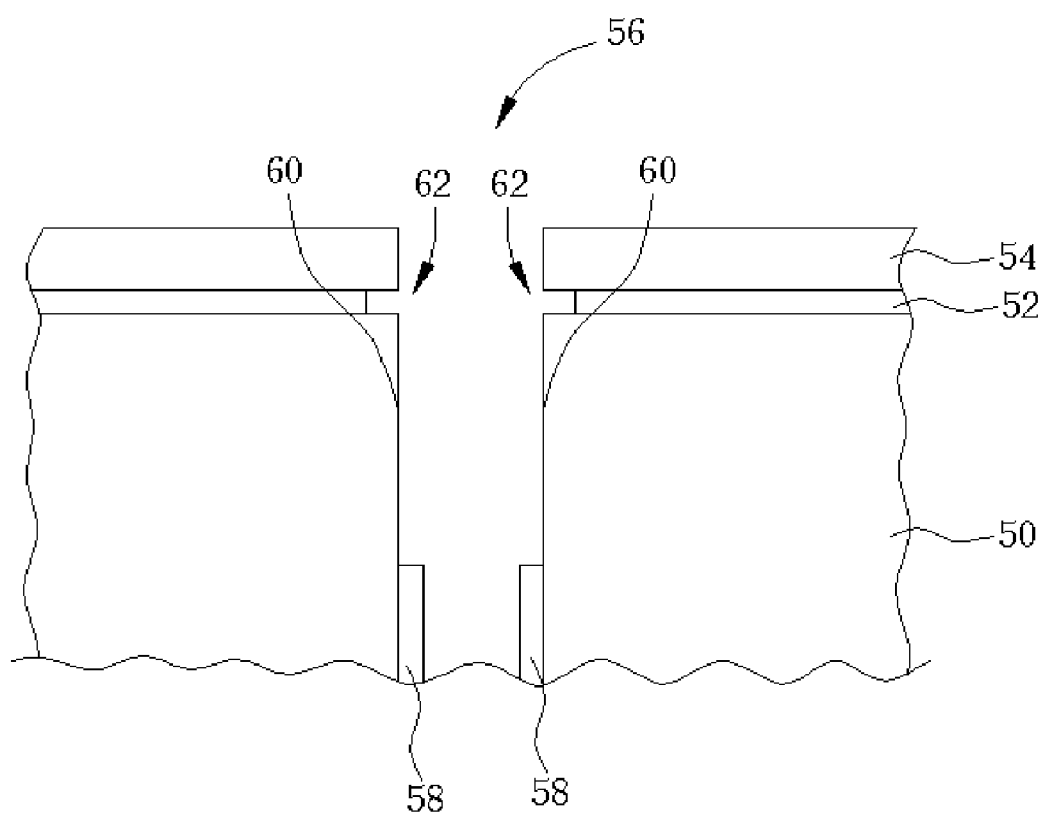

As shown in FIG. 6, a chemical vapor deposition (CVD) process is performed to form an arsenic silicate glass film 58 on the inner wall of the deep trench 56. Then a sacrificial layer (not shown in FIG. 6) is deposited to fill up the deep trench 56, and the sacrificial layer (not shown) is etched back to expose a portion of the arsenic silicate glass film 58. Afterward, an anisotropic etching process is performed to remove the exposed arsenic silicate glass film 58 such that a collar region 60 is formed in the inner wall of the deep trench 56. At the same time, a portion of the pad oxide layer 52 is removed during the anisotropic etching process to form a recess 62. Finally another etching process is performed to remove the remaining sacrificial layer (not shown).

Figure 7:
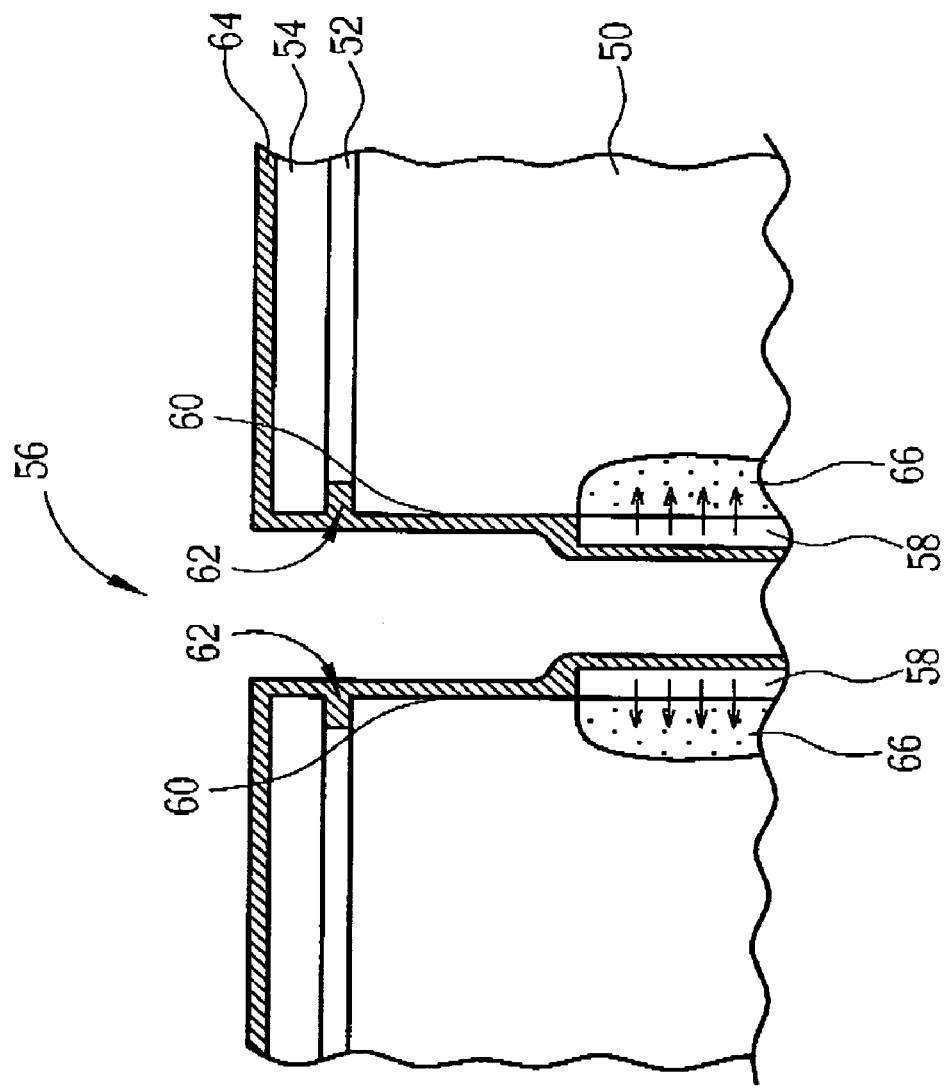

As shown in FIG. 7, a chemical vapor deposition process is performed to farm a silicon nitride layer 64 on the inner wall of the deep trench 56, and to fill up the recess 62 with the silicon nitride layer 64 as well. Then a thermal process is performed to diffuse the arsenic ions of the arsenic silicate glass film 58 into the substrate 50, such that a doped region 66 is formed.

Figure 8:
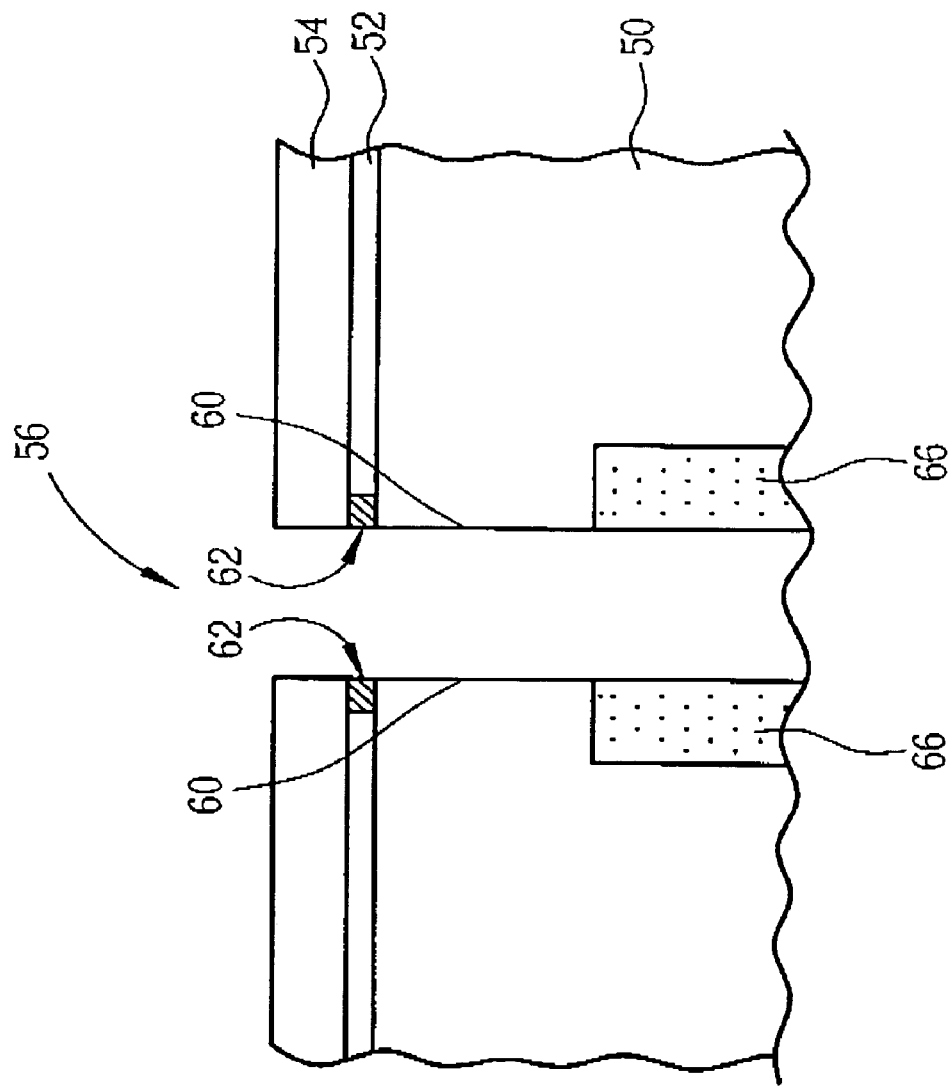

As shown in FIG. 8, an anisotropic etching process is performed by use of hydrofluoric acid (HF) and ethylene glycol (EG) as an etching solution to remove the silicon nitride layer 64 outside the recess 62. Finally, another etching process is performed to remove the arsenic silicate glass film 58 to carry out the deep trench capacitor buried plate of the present invention.

It has been shown that the prior art method forms a TEOS layer on the inner wall of the deep trench as a barrier layer and performs a thermal process to form an arsenic doped region at the bottom of the deep trench. Nevertheless, TEOS has poor step coverage ability, therefore a void will easily occur in the opening of the deep trench. In addition, the TEOS layer is not able to afford good results as a barrier layer, thus the arsenic ions will easily pass through the TEOS layer and diffuse to the collar region.

It also has to be noted that the pad oxide layer and the TEOS layer are both composed of silicon oxide, as a result parts of the pad oxide layer will be removed when the TEOS layer is etched. The removal of the pad oxide layer would increase the critical dimension of the deep trench, and further lead to a short circuit between neighboring deep trenches.

Comparing to the prior art, the method of the present invention forms a silicon nitride layer on the inner wall of the deep trench as a barrier layer. Since silicon nitride has better step coverage ability and better barrier effect than TEOS, the arsenic ions will not diffuse into the collar region of the deep trench. Furthermore, it has to be noted that the method of the present invention forms a recess in the pad oxide layer and fills silicon nitride into the recess as a passivation layer, such that the problem of the deep trench enlargement is prevented.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming a deep trench capacitor buried plate comprising:
    providing a substrate having a pad oxide layer and a pad nitride layer thereon, the pad oxide layer and the pad nitride layer having at least an opening;
    performing a dry etching process for forming a deep trench in the substrate via the opening;
    depositing a doped silicate glass film on an inner wall of the deep trench;
    filling a sacrificial layer into the deep trench;
    etching back the sacrificial layer for exposing parts of the doped silicate glass film;
    removing the exposed doped silicate glass film;
    removing the remaining sacrificial layer;
    depositing a silicon nitride layer on the inner wall of the deep trench;
    performing a thermal process for forming a doped region at a bottom of the trench after the remaining sacrificial layer is removed;
    removing the silicon nitride layer; and
    removing the doped silicate glass film;
    wherein the silicon nitride layer serves as a barrier layer for preventing ions of the doped silicate glass film from diffusing into a collar region of the deep trench.

2. The method of claim 1 wherein the doped silicate glass film is an arsenic silicate glass (ASG) film.

3. The method of claim 2 wherein the arsenic silicate glass film is formed by a chemical vapor deposition (CVD) process.

4. The method of claim 1 wherein the silicon nitride layer is formed by a chemical vapor deposition process.

5. The method of claim 1 wherein the doped silicate glass film is removed by an anisotropic etching process.

6. The method of claim 1 wherein the silicon nitride layer is removed by an anisotropic etching process.

7. A method for forming a deep trench capacitor buried plate comprising:
    providing a substrate having a pad oxide layer and a pad nitride layer thereon, the pad oxide layer and the pad nitride layer having at least an opening;
    performing a dry etching process for forming a deep trench in the substrate via the opening;
    depositing a doped silicate glass film on an inner wall of the deep trench;
    filling a sacrificial layer into the deep trench; removing a portion of the sacrificial layer for exposing parts of the doped silicate glass film;
    performing an etching process to remove the exposed doped silicate glass film and a portion of the pad oxide layer for forming a recess;
    removing the remaining sacrificial layer;
    depositing a silicon nitride layer on the inner wall of the deep trench and filling up the recess with the silicon nitride layer;
    performing a diffusing process for forming a doped region at a bottom of the trench;
    removing the silicon nitride layer; and
    removing the doped silicate glass film;
    wherein the silicon nitride layer serves as a barrier layer for preventing ions of the doped silicate glass film from diffusing into a collar region of the deep trench.

8. The method of claim 7 wherein the doped silicate glass film is an arsenic silicate glass (ASG) film.

9. The method of claim 8 wherein the arsenic silicate glass film is formed by a chemical vapor deposition (CVD) process.

10. The method of claim 7 wherein the silicon nitride layer is formed by a chemical vapor deposition process.

11. The method of claim 7 wherein the etching process is an anisotropic etching process.

12. The method of claim 7 wherein the silicon nitride layer is removed by an anisotropic etching process.

13. A method for forming a deep trench capacitor buried plate comprising:
    providing a substrate having a pad oxide layer and a pad nitride layer thereon, the pad oxide layer and the pad nitride layer having at least an opening;
    performing an etching process for forming a deep trench in the substrate via the opening;
    depositing a doped silicate glass film on an inner wall of the deep trench;
    filling a sacrificial layer into the deep trench;

etching back the sacrificial layer for exposing parts of the doped silicate glass film;

removing the exposed doped silicate glass film and forming a collar region in the inner wall of the deep trench;

removing the remaining sacrificial layer;

depositing a silicon nitride layer on the surface of the collar region in the inner wall of the deep trench and on the surface of the remaining silicate glass film after removing the remaining sacrificial layer;

performing a thermal process for forming a doped region at a bottom of the trench;

removing the silicon nitride layer; and removing the doped silicate glass film.

14. The method of claim 13 wherein the doped silicate glass film is an arsenic silicate glass (ASG) film.

15. The method of claim 14 wherein the arsenic silicate glass film is formed by a chemical vapor deposition (CVD) process.

16. The method of claim 13 wherein the silicon nitride layer is formed by a chemical vapor deposition process.

17. The method of claim 13 wherein the doped silicate glass film is removed by an anisotropic etching process.

18. The method of claim 13 wherein the silicon nitride layer is removed by an anisotropic etching process.

19. The method of claim 13 wherein the silicon nitride layer serves as a barrier layer for preventing ions of the doped silicate glass film from diffusing into a collar region of the deep trench.

* * * * *